United States Patent
Wunderlich et al.

(10) Patent No.: US 8,819,930 B2
(45) Date of Patent: Sep. 2, 2014

(54) METHOD FOR IMPROVING THE ADHESION BETWEEN SILVER SURFACES AND RESIN MATERIALS

(75) Inventors: Christian Wunderlich, Velten (DE); Robert Rüther, Oranienburg (DE); Jürgen Barthelmes, Berlin (DE); Sia-Wing Kok, Penang (MY); Nadine Menzel, Berlin (DE)

(73) Assignee: Atotech Deutschland GmbH, Berlin (DE)

(*) Notice: Subject to any disclaimer, the term of this patent is extended or adjusted under 35 U.S.C. 154(b) by 540 days.

(21) Appl. No.: 13/123,668

(22) PCT Filed: Sep. 10, 2009

(86) PCT No.: PCT/EP2009/006580
§ 371 (c)(1),
(2), (4) Date: Jul. 27, 2011

(87) PCT Pub. No.: WO2010/043291
PCT Pub. Date: Apr. 22, 2010

(65) Prior Publication Data
US 2012/0020047 A1    Jan. 26, 2012

(30) Foreign Application Priority Data
Oct. 13, 2008 (EP) .................... 08166416

(51) Int. Cl.
H05K 3/30    (2006.01)
H01L 21/67    (2006.01)
H01L 23/31    (2006.01)
H01L 23/495    (2006.01)
H05K 3/38    (2006.01)
H01L 23/00    (2006.01)

(52) U.S. Cl.
CPC .... *H01L 23/49582* (2013.01); *H01L 21/67063* (2013.01); *H05K 3/383* (2013.01); *H01L 2224/45144* (2013.01); *H01L 2924/00014* (2013.01); *H01L 23/3142* (2013.01); *H01L 2924/01014* (2013.01); *H01L 24/45* (2013.01); *H01L 2924/01019* (2013.01); *H01L 2924/01012* (2013.01); *H01L 2924/01013* (2013.01); *H01L 2924/01028* (2013.01); *H01L 2224/85439* (2013.01); *H01L 2224/45124* (2013.01)
USPC ............... 29/841; 29/592.1; 29/825; 29/829; 29/832; 427/532; 427/457; 205/687; 205/704; 205/106; 148/95; 216/100

(58) Field of Classification Search
USPC ......... 29/592.1, 825, 829, 832, 841; 427/532, 427/457, 337; 205/687, 704; 148/95; 216/100
See application file for complete search history.

(56) References Cited

U.S. PATENT DOCUMENTS

| 3,342,710 | A | * | 9/1967 | Nakamura et al. ............. 205/319 |
| 4,755,265 | A | * | 7/1988 | Young ........................ 205/234 |
| H1136 | H | * | 2/1993 | Janikowski .................. 205/263 |
| 5,300,158 | A | | 4/1994 | Chen et al. |
| 5,343,073 | A | | 8/1994 | Parthasarathi et al. |
| 5,449,951 | A | | 9/1995 | Parthasarathi et al. |
| 5,459,103 | A | * | 10/1995 | Kelleher et al. ............. 205/125 |
| 5,788,822 | A | * | 8/1998 | Martyak et al. ............. 205/313 |
| 6,852,427 | B1 | | 2/2005 | Howell et al. |
| 2004/0101624 | A1 | * | 5/2004 | Bayes ........................ 427/337 |
| 2005/0121330 | A1 | | 6/2005 | Howell et al. |
| 2007/0021298 | A1 | * | 1/2007 | Kunita et al. ................ 502/325 |
| 2007/0246691 | A1 | * | 10/2007 | Luo et al. .................... 252/519.3 |

FOREIGN PATENT DOCUMENTS

| CN | 101058893 A | 10/2007 |
| EP | 1 662 565 A2 | 5/2006 |
| EP | 1 820 884 A1 | 8/2007 |

OTHER PUBLICATIONS

C.Q. Cui et al., "Adhesion Enhancement of Pd Plated Leadframes", 1999 Electronic Components and Technology Conference, p. 837-841.
Office Action issued on Jan. 8, 2014 in corresponding Taiwanese Application Ser. No. 098131233, 5 pages.
U.S. Statutory Invention Registration No. H1136, Appl. No. 800,291, Published Feb. 2, 1993, 4 pages.

* cited by examiner

*Primary Examiner* — Peter DungBa Vo
*Assistant Examiner* — Azm Parvez
(74) *Attorney, Agent, or Firm* — Edwards Wildman Palmer LLP; Peter F. Corless

(57) ABSTRACT

The invention addresses the problem of improving the adhesion between silver surfaces and resin materials, such as epoxy resins and mold materials, used in the production of electronic devices. The invention provides a method for improving the adhesion between a silver surface and a resin material comprising a step of electrolytically treating the silver surface with a solution containing a hydroxide selected from alkali metal hydroxides, alkaline earth metal hydroxides, ammonium hydroxides and mixtures thereof, wherein the silver surface is the cathode. In a particular embodiment of this method, the present invention provides a method for producing a surface mounted electronic device comprising the following steps: (i) providing a lead frame having copper and silver surfaces, (ii) electrolytically treating the silver surfaces of the lead frame with a solution containing a hydroxide selected from alkali metal hydroxides, alkaline earth metal hydroxides, ammonium hydroxides and mixtures thereof, wherein the lead frame is the cathode, (iii) encapsulating an electronic device together with the lead frame using a resin material.

12 Claims, No Drawings

METHOD FOR IMPROVING THE ADHESION BETWEEN SILVER SURFACES AND RESIN MATERIALS

FIELD OF THE INVENTION

The invention relates to a method for improving the adhesion between silver surfaces and resin materials, such as epoxy resins and mold materials. Such a method is useful in the production of electronic devices such as lead frames and surface mounted devices (SMDs).

BACKGROUND OF THE INVENTION

Lead frames are used in the production of electronic devices mounted on printed circuit boards (surface mounted devices, SMDs). One step in the production of SMDs is the applications of a resin (mold) material on top of the lead frame for protection purposes, i.e. the formation of so-called packages. Lead frames usually contain copper and silver surfaces. Thus, the mold is in contact with silver and copper surfaces of the lead frame. During SMD product life time it must be guaranteed that there will occur no delamination between metal and mold, otherwise the SMD part may fail.

During the lifetime of the package, ambient moisture may be absorbed at the interface of mold and lead frame. The problem with moisture absorption and retention inside the package is that the trapped moisture will vaporize and exert tremendous internal package stress when the device is subjected to sudden elevated temperature, such as the solder temperature during board mounting, and this may lead to delamination. This moisture-induced delamination is called "popcorn effect". To avoid the popcorn effect the packages must be packed or re-packed under moisture free conditions to avoid absorption prior to soldering, which makes the assembly process more costly and quality control more difficult. Due to the higher soldering temperatures used in lead-free soldering applications the risk of the popcorn effect occurring is particularly high, resulting in more package failure.

In recognition of the varying degrees of popcorn cracking tendency of various package types, IPC/JEDEC defined a standard classification of moisture sensitivity levels (MSLs) of leaded IC packages. According to this standard (J-STD-20 MSL), MSLs are expressed in terms of numbers, with the MSL number increasing with the vulnerability of the package to popcorn cracking. Thus, MSL1 correspond to packages that are immune to popcorn cracking regardless of exposure to moisture, while MSL5 and MSL6 devices are most prone to moisture-induced fracture. The target is to achieve MSL1.

According to the J-STD-20 MSL standard, the whole device is tested for a certain time under specified moisture and temperature conditions (see Table 1).

TABLE 1

| | | | IPC/JEDEC J-STD-20 MSL Classifications | | | |
|---|---|---|---|---|---|---|
| | | | | Soak Requirements | | |
| | Floor Life | | Standard[1] | | Accelerated | |
| Level | Time | Conditions [° C./% RH] | Time [h] | Conditions [° C./% RH] | Time [h] | Conditions [° C./% RH] |
| 1 | unlimited | ≤30/85 | 168 + 5/−0 | 85/85 | n/a | n/a |
| 2 | 1 year | ≤30/60 | 168 + 5/−0 | 85/60 | n/a | n/a |
| 2a | 4 weeks | ≤30/60 | 696 + 5/−0 | 30/60 | 120 + 1/−0 | 60/60 |
| 3 | 168 hours | ≤30/60 | 192 + 5/−0 | 30/60 | 40 + 1/−0 | 60/60 |
| 4 | 72 hours | ≤30/60 | 96 + 2/−0 | 30/60 | 20 + 0.5/−0 | 60/60 |
| 5 | 48 hours | ≤30/60 | 72 + 2/−0 | 30/60 | 15 + 0.5/−0 | 60/60 |
| 5a | 24 hours | ≤30/60 | 48 + 2/−0 | 30/60 | 10 + 0.5/−0 | 60/60 |
| 6 | TOL[2] | ≤30/60 | TOL[2] | 30/60 | n/a | 60/60 |

[1]The standard soak time is the sum of the default value of 24 h for the semiconductor manufacturer's exposure time (MET) between bake and bag and the floor life or maximum time allowed out of the bag at the end user or distributor's facility. For example, an MSL 3 package will require a standard soak time of 192 hours, which is 168 hours of floor life plus 24 hours between bake and bag at the semiconductor manufacturer.
[2]TOL means "Time on Label", i.e. the time indicated on the label of the packing.

In order to ensure sufficient adhesion under real life conditions, leaded IC packages are tested according to the IPC/JEDEC J-STD-20 MSL standard. Another practical test for adhesion strength is the so called Tab Pull Test which is common in the industry for qualification purposes. An indication of the strength of adhesion between a metal surface and mold may also be obtained from a simple Peeling Test. Both, the Tab Pull Test and the Peeling Test are used during the development and qualification phase as a good tool to identify improvements in adhesion between a metal surface and a resin material. The Tab Pull and the Peeling Test are typically performed on a test specimen rather than a real package. For the MSL test on real packages, C-Mode Scanning Acoustic Microscopy (C-SAM) can be used to detect delamination at the interface between silver and mold.

The achievable moisture sensitivity level depends not only on the adhesion between mold and lead frame surface but also on the package size and dimension. In general, SMDs are prone to popcorn cracking, because they are thin and therefore have lower fracture strength; they absorb and retain moisture more easily; and SMD board mounting also subjects the molding compound to the high temperature experienced by the leads.

The surface of most lead frames currently produced typically consist of two metals, namely copper or copper alloy, which is the lead frame base material, and silver. The relative proportions of copper and silver will vary between different lead frames. The base material influences the thermal and mechanical stability of the lead frame. Silver at the lead frame surface is required to create an electrically conducting connection between the lead frame and the chips mounted thereon. During further processing of lead frames, this is usually done by Thermo Sonic Bonding (TSB), which involves the contacting of a thin wire to both, the chip and the silver on the lead frame.

Thermo Sonic Bonding, which will also be referred to as wire bonding, is a surface-welding process in which two clean metal surfaces (substrate and wire) are brought into contact so as to create a stable bond between the bonding wire (which usually consists of gold, but may also consist of aluminium) and the silver on the lead frame substrate. Thus, this process is sensitive to impurities on the metal surfaces.

As far as copper and copper alloy surfaces of lead frames are concerned, it is now common in lead frame production to roughen the copper or copper alloy surface in order to improve the adhesion between that surface and the resin material (mold) subsequently used in the production of SMDs. The roughening is usually achieved by a chemical etching process; but it may also be achieved electrochemically, i.e., by applying an anodic current to the copper material. Some of the chemical etching processes also produce an oxide layer on the copper surfaces, which has a positive effect on adhesion, because metal oxide surfaces generally show better adhesion to resins than oxide-free metal surfaces. However, the effect of such an oxide layer is probably rather small compared to the effect of chemical roughening.

A standard process for roughening copper or copper alloy on the surface of lead frames and thereby improving adhesion of resin materials (molds) to the copper or copper alloy is the MoldPrep™ process developed by Atotech (see EP 1 820 884 A1). The MoldPrep™ process can be applied to lead frames which are already plated with silver. However, this process does not affect the silver surface. Thus, it has no influence on the adhesion of resin material to silver.

It has been found that, irrespective of how the copper material has been roughened, only the adhesion between copper and resin material is improved. None of the known processes for roughening copper or copper alloy surfaces results in a significant improvement of adhesion between silver and resin material. Therefore, the contact between silver and resin material is the weakest link between lead frames and resin materials and, thus, prevents further improvements in the MSL properties of SMDs.

In view of this situation, manufacturers of lead frames and SMDs are trying to minimize the silver surface area and maximize the relative proportion of copper surfaces in order to increase system stability. However, there are limits to this approach since certain minimum silver surface areas are required for contacting the chips to the lead frame surface.

STATE OF THE ART

The lead frame industry has been striving for many years to improve the adhesion between resin materials (molds) and various metals, such as copper, copper alloys, silver, Alloy 42 and combinations of layers of nickel/palladium/gold (as used in so-called pre-plated frames (PPFs)). The PPF process achieves a marginal improvement in adhesion by roughening copper before depositing nickel/palladium/gold. Another possibility to improve the adhesion of resin materials to PPFs is to deposit the nickel in rough form by appropriate control of the electroplating parameters. Rough nickel results in improved adhesion to resin materials by mechanical anchoring. However, the adhesion achieved by this method is still not as good as the adhesion to copper and its alloys that can be achieved today. Therefore, the improvement in adhesion achieved by this method is not yet sufficient.

Cui et al. ("Adhesion Enhancement of Pd Plated Leadframes", 1999 Electronic Components and Technology Conference, p. 837) disclose that iron can be deposited along grain boundaries by applying a cathodic current to a lead frame in an iron containing alkaline solution. According to the authors, the deposition of iron on the PPF surface results in improved adhesion to resin materials. However, wire bondability is reduced at the same time. Wire bondability deteriorates as more iron is deposited on the surface. Presumably, it is for this reason and due to the fact that iron is sensitive to oxidation by air that the method described by Cui et al. is not used industrially.

U.S. Pat. Nos. 5,343,073 and 5,449,951 describe lead frames wherein the adhesion to resin materials is to be improved by electrolytic deposition of chromium and zinc. Since the method described in these patents involves the use of chromium(VI), it is disadvantageous with respect to environmental protection requirements. The use of zinc is also disadvantageous since, like iron and contrary to what is stated in these patents, the bondability of gold wire to zinc is poor.

U.S. Pat. No. 5,300,158 describes the use of chromium(VI) for protection against corrosion and for improving adhesion to substrates consisting of copper or copper alloy.

U.S. Pat. No. 6,852,427 discloses that a solution containing at least one metal (for example, zinc) can be used to protect copper against corrosion and, at the same time, achieves an improvement in adhesion. This patent relates primarily to the avoidance of the use of chromium(VI).

U.S. patent application US 2005/0121330 A1 (which is a divisional application of the aforementioned U.S. Pat. No. 6,852,427) also only relates to copper surfaces. Silver and the bondability of gold wire to silver surfaces are not considered in this patent.

DESCRIPTION OF THE INVENTION

Thus, it is an object of the present invention to improve the adhesion of resin materials, such as those used as mold materials for the production of electronic devices, to silver surfaces, especially silver surfaces of lead frames, so as to enable the production of electronic packages having good moisture sensitivity levels, ideally achieving moisture sensitivity level MSL1. At the same time, fault-free wire bonding to the silver surfaces must be possible. Also, the good adhesion properties of roughened copper or copper alloy surfaces present at the same time must not be deteriorated.

The inventors' attempts to selectively etch silver so as to increase its roughness were unsuccessful. This approach was abandoned for the following reasons: Firstly, the etching of the silver was so uneven as to result in the formation of pores. Secondly, due to the insufficient selectivity of the silver etching solutions tested, the copper was also unevenly etched, which resulted in a deterioration of the adhesion of resin materials to the copper surface.

The inventors also attempted to improve the adhesion of resin materials to silver by depositing silver in rough form. However, the roughness values that could be achieved were not sufficient to result in improved adhesion or the silver was deposited in powdery form, which did not result in improved adhesion either. Nevertheless, rough silver might be critical for the bonding process.

In analogy to the PPF method described above, the inventors also attempted to roughen the copper before depositing silver and then to deposit silver on the roughened copper. However, it was found that even marked increases in roughness did not produce the desired improvements in adhesion. It was only when the inventors found the method according to the present invention that the problem of poor adhesion between silver surfaces and resin materials, especially those used as mold materials, could be solved.

Thus, to achieve the above objects, the invention provides a method for improving the adhesion between a silver surface and a resin material comprising a step of electrolytically treating the silver surface with a solution containing a hydroxide selected from alkali metal hydroxides, alkaline earth metal hydroxides, ammonium hydroxides and mixtures thereof, wherein the silver surface is the cathode.

In the method according to the present invention the silver surface to which the resin material is eventually to adhere is brought into contact with a solution containing a hydroxide as specified above. The solution is also brought into contact with at least one anode and a voltage is applied between the silver surface, acting as the cathode, and at least one anode so as to pass an electric current through the solution. The silver surface thus treated shows improved adhesion to resin materials, in particular those used as mold materials for the manufacture of electronic components such as surface mounted devices (SMDs).

In a particular embodiment of the above method, the present invention provides a method for producing a surface mounted electronic device (SMD) comprising the following steps: (i) providing a lead frame having at least one silver surface, (ii) electrolytically treating the silver surface of the lead frame with a solution containing a hydroxide selected from alkali metal hydroxides, alkaline earth metal hydroxides, ammonium hydroxides and mixtures thereof, wherein the lead frame is the cathode, (iii) encapsulating an electronic device together with the lead frame using a resin material. The lead frame may also comprise at least one copper surface. If present, any copper surfaces will be subjected to the same treatment and conditions as the at least one silver surface. As the inventors have found, this has no measurable effect on the copper surfaces.

The step of electrolytically treating the silver surface will generally be carried out before any leads are bonded to the silver surface. However, in principle, it will also be possible to carry the step of electrolytically treating the silver surface out after the bonding step.

Thus, the present invention also provides an electronic device wherein a resin material is in contact with silver, the device being obtained by the above method.

The step of electrolytically treating the silver surface can be carried out batchwise or in a continuous mode. In the batchwise mode, at least one workpiece is treated at a time in a rack and barrel type application. In the continuous mode, workpieces (in particular, lead frames) may be treated in a reel-to-reel type application. Thus, in the continuous process, one can plate strips of manufactured products or reels of substrate material before they are separated into individual parts.

The temperature of the solution with which the silver surface is treated is not particularly limited. Generally, this temperature will be from 15 to 75° C., preferably from 20 to. 50° C., more preferably from 35 to 45° C.

The duration of the electrolytic treatment of the silver surface is not particularly limited. Generally, this duration will be from 5 to 300 seconds, preferably from 25 to 60 seconds. Generally, longer durations of the treatment will result in greater improvements of adhesion between the silver surface and resin material. However, longer durations may be disadvantageous, especially when the treatment is carried out in a continuous mode where work pieces to be treated are moved through an electrolytic bath and long treatment durations might thus require excessively long distances from one end of the bath to the other. Short treatment durations may be achieved by increasing the cathodic current density accordingly. This may require an appropriate increase in the size of the anode(s) to avoid excessive voltages.

The current density applied in the step of electrolytically treating the silver surface is not particularly limited. Generally, the cathodic current density may be from 2 to 40 $A/dm^2$, preferably 4 to 32 $A/dm^2$. When the treatment solution contains only a hydroxide (for example only sodium hydroxide), the cathodic current density will generally be from 8 to 24 $A/dm^2$, preferably from 12 to 16 $A/dm^2$. When the treatment solution additionally contains a silicate, the cathodic current density will generally be 4 to 16 $A/dm^2$, preferably 8 to 12 $A/dm^2$. Generally, higher current densities result in greater improvements in adhesion. In principle, the current density is limited only by the voltage applied between the cathode and anode(s).

The voltage applied in the step of electrolytically treating the silver surface is not particularly limited. It depends, inter alia, on the ratio of cathode to anode surface areas, the concentration of electrolytes and the current density. Generally the voltage will be less than 7 V.

The material of the at least one anode used in the step of electrolytically treating the silver surface is not particularly limited, except that the anode(s) should be essentially inert, i.e., the anode(s) should not dissolve to any significant degree. Thus, the anode(s) may be made of stainless steel, such as V4A or SS316/319 steel, or, for example, of platinum-plated titanium. Dissolution of the anode(s) can be avoided by controlling the voltage, i.e. avoiding excessively high voltages.

The ratio of the surface areas of the anode(s) and the cathode is not particularly limited. Generally, the ratio of surface areas of anode:cathode will be at least 2:1, preferably at least 4:1, more preferably at least 8:1.

The solution with which the silver surface is electrolytically treated contains a hydroxide selected from alkali metal hydroxides, alkaline earth metal hydroxides, ammonium hydroxides and mixtures thereof. Preferred alkali metal hydroxides are sodium hydroxide (NaOH) and potassium hydroxide (KOH). Suitable ammonium hydroxides are ammonium hydroxides of the formula $NR_{4-n}H_nOH$, wherein each R is independently an alkyl group having 1 to 12, preferably 1 to 6, carbon atoms. Preferred hydroxides are sodium hydroxide and potassium hydroxide.

The concentration of the hydroxide in the treatment solution is generally from 10 to 500 g/l, preferably 100 to 200 g/l, for example, about 150 g/l. Lower concentrations of hydroxide are generally sufficient if the treatment solution contains any of the conductivity-enhancing or adhesion-improving salts described below.

The treatment solution can additionally contain a silicate salt, such as sodium or potassium or ammonium metasilicate. So-called sesquisilicates, such as $Na_3HSiO_4.5H_2O$ or the corresponding alkali and ammonium salts, may also be used. Preferred silicate salts are polysilicates, preferably soluble alkali metal or ammonium polysilicates, which may be described by the formula $M_2O.n\ SiO_2$, wherein n is about 1 to 4 and M is an alkali metal or a ammonium ion of the general formula $NR_{4-n}H_n^+$, wherein each R is independently an alkyl group having 1 to 12, preferably 1 to 6, carbon atoms.

It has been found that the presence of such silicates in the treatment solution results in even greater improvements in adhesion between the treated silver surface and resin. The concentration of the silicate salt in the treatment solution, if used, will generally be from 1 to 100 g/l, preferably 10 to 50 g/l.

Optionally, the treatment solution may contain one or more conductivity-enhancing salts. Preferred conductivity-enhancing salts are sulfates and polyphosphates, preferably with alkali, ammonium or alkaline earth cations, for example, sodium or potassium sulfate ($Na_2SO_4$ or $K_2SO_4$) or sodium or potassium tripolyphosphate ($Na_5P_3O_{10}$ or $K_5P_3O_{10}$); the corresponding ammonium salts (($NH_4$)$_2SO_4$ or ($NH_4$)$_5P_3O_{10}$) may also be used. Such conductivity-enhancing salts can be used to reduce the voltage between the cathode and the anode(s) and to increase the current density. The concentration of conductivity-enhancing salts in the treatment solution, if used, will generally be from 1 to 100 g/l, preferably from 10 to 50 g/l. Such salts were found not to have an adhesion-enhancing effect when used alone.

The pH of the treatment solution is >7, preferably >10.

Optionally, the treatment solution may contain one or more surfactants. The surfactant(s) may be ionic or non-ionic. Suitable ionic surfactants include anionic surfactants, such as sulfate-, sulfonate- or carboxylate-based surfactants (for example, sodium dodecyl sulfate, ammonium lauryl sulfate, and other alkyl sulfate, alkyl benzene sulfonate and fatty acid salts, e.g. sodium dodecylbenzenesulfonate) and cationic surfactants, such as alkyl trimethyl ammonium salts (for example, cetyl trimethyl ammonium bromide), cetyl pyridinium chloride and benzalconium chloride. Suitable non-ionic surfactants include alkyl poly(ethylene oxide), copolymers of ethylene oxide and propylene oxide, fatty alcohols (for example, cetyl alcohol and oleyl alcohol), polyethylene glycols (for example, polyethylene glycol 10.000), and ethylene glycol ethers (for example, ethylene glycol monobutylether). Such surfactants facilitate the wetting of the silver surface to be treated.

The step of electrolytically treating the silver surface is carried out without depositing any metals on the silver surface. Therefore, the treatment solution is essentially free of metal ions other than alkali or alkaline earth metal ions. In particular, the treatment solution is essentially free of iron, zinc and chromium ions, especially $Fe^{2+}$, $Fe^{3+}$, $Zn^{2+}$, $Cr^{3+}$ and Cr(VI) ions. In this connection the expression "essentially free" means that the solution does not contain the specified ions except to the extent that these constitute practically unavoidable impurities. The presence of silicon (as silicate) is of course not excluded (see above).

The method according to the present invention can be used generally to improve the adhesion of any silver surface to resin materials, in particular, the resin materials used as molding materials in the manufacture of electronic devices, such as so-called Surface Mounted Devices (SMDs). The method of the present invention can be applied, in particular to lead frames having silver surfaces. The method according to the present invention can be combined with known methods for roughening copper or copper alloy surfaces, which are also present in lead frames. In particular, the method according to the present invention can be combined with the MoldPrep™ process commercialized by Atotech, which is described in EP 1 820 884 A1. In this case, the copper-roughening process is first carried out as usual and then the method according to the present invention is applied to treat the silver surface.

Silver surfaces treated according to the present invention can be bonded to gold wire by known processes, in particular by Thermo Sonic Bonding (TSB). The silver surface can consist of substantially pure silver or of a silver alloy having a sufficiently high silver content.

Silver surface treated according to the present invention show improved adhesion to resin materials, in particular resin materials typically used as molding materials for the manufacture of electronic packages. In particular, in the context of the present invention, the resin material can be an epoxy resin or an epoxy-molding compound such as the commercially available product Sumikon EME-G600™, which consists of 75 to 95 wt.-% of fused silica, 2 to 8 wt.-% of epoxy resin, 1 to 3 wt.-% of epoxy cresol novolac, 2 to 8 wt.-% of phenol resin and 0.1 to 0.5 wt.-% of carbon black, or the molding compound Sumikon EME 7351 TQ™, which consist of about 86 wt.-% of silica powder, about 1.0 wt.-% of antimony trioxide, about 11 wt.-% of epoxy resin, about 1.0 wt.-% of bromated resin, and about 1.0 wt.-% of catalyst, flexibilizer, mold release, pigments and primer. The molding compound can also be a bromine-free ("green") molding material consisting of about 80 wt.-% of fused silica, a flexible epoxy resin and hardener, transition metal oxide/nitrogen flame retardants, rubber or thermoplastic flexibilizer and silanes.

Examples

The invention will now be illustrated by reference to the following non-limiting examples.

Test Methods

The test methods used in the examples are as follows:

Lab Peeling Test

The Lab Peeling Test is carried out on silver foils laminated onto an epoxy glass fiber substrate by measuring the force needed to peel the foil from the epoxy layer. More specifically, a silver foil (99.97% Ag, length: 130 mm, width: 30 mm, thickness: 50 µm) is degreased with an organic solvent and then laminated onto an Isola Duraver DE104ML™ epoxy glass fiber prepreg (Glass type 2125, Tg: 135° C., size: 25×25 cm) and the epoxy prepreg is hardened at the same time by pressing at up to 175° C. using a pressing machine (manufactured by HML; type: MP20-2-VK) and the temperature and pressure program specified in the following table:

| Phase | Temperature [° C.] | Ramp up/down time [min] | Hold time [min] | Pressure [kPa] |
|---|---|---|---|---|
| Heating and Pressing | 30 | 0 | 1 | 0 |
| | 140 | 30 | 5 | 980 |
| | 175 | 15 | 80 | 1960 |
| Cooling | 140 | 15 | 0 | 1960 |
| | 100 | 15 | 0 | 1960 |
| | 50 | 15 | 0 | 980 |
| | 20 | 0 | 0 | 0 |

Thereafter, the silver/epoxy laminate is allowed to cool to room temperature. Then the force need to peel the silver foil from the epoxy substrate is measured relative to the width of the silver foil using a measuring device manufactured by Zwick (type: Z 010) at a peeling angle of 90° and a rate of 50 mm/min over a distance of 100 mm.

Tab Pull Test

In the Tab Pull Test a copper lead frame with an equilateral triangular silver area (ca. 7 $mm^2$) is used. A mold (Sumikon EME-G600™) is applied to the silver surface and hardened. The mold is then subjected to a pulling force. The force needed to detach the mold from the silver surface is measured (in kg).

Bond Test

The Bond Test was carried out with the following equipment, materials and parameters:

Bonder (device): Delvotec 5410 (semi-automatic ball/wedge bonding)

Ultrasonic frequency: 60 kHz

Power setting (a.u.): Ball bond: 40; wedge bond: 140

Time setting (a.u.): Ball bond: 30; wedge bond: 60

Force setting (a.u.): 20

Bond wire: Au HD2 (Heraeus), diameter: 25 µm, break-load: >7 g

Capillary: UTS-41KJ-CM-1/16-16 mm

Temperature: 150° C.

Pull tester: DAGE 4000; WP100 cartridge, pull speed: 500 μm/s
No. of pulls: 30
Treatment Solutions
The treatment solutions used in these examples were aqueous solutions having the compositions specified in Table 2:

TABLE 2

Composition of treatment solutions according to the invention

| Treatment Solution | Alkali metal hydroxide | Other components |
|---|---|---|
| A | 15 g/l NaOH | — |
| B | 100 g/l KOH | — |
| C | 150 g/l NaOH | 50 g/l potassium tripolyphosphate ($K_5P_3O_{10}$) |
| D | 15 g/l NaOH | 12 g/l sodium metasilicate 5 g/l sodium tripolyphosphate ($Na_5P_3O_{10}$) |

Example 1

A silver foil was degreased with an organic solvent. It was then subjected to an electrolytic adhesion improvement treatment according to the present invention by dipping it in Treatment Solution A for 60 seconds at 40° C. while applying a direct current. The silver foil was connected as the cathode. Anodes were made of steel. The current density at the cathode was 9 A/dm².

The silver foil was then subjected to the Lab Peeling Test as specified above. For comparison, the test was carried out on a silver foil which had only been degreased but not subjected to the electrolytic adhesion improvement treatment according to the present invention.

The results of the Lab Peeling Test are set forth in Table 3.

TABLE 3

Results of the Lab Peeling Tests carried out in Example 1.

| Specimen tested | Adhesion strength [N/cm] |
|---|---|
| Silver foil treated according to the invention | 1.7 |
| Comparison | 0.7 |

Example 2

A standard lead frame (as used in the Tab Pull Test, see above) was subjected to the MoldPrep LF™ pre-treatment by dipping it into the solutions specified in Table 4 for the times and at the temperatures specified in that table (see Table 4, steps 1 to 5).

The lead frame was then subjected to an electrolytic adhesion improvement treatment according to the present invention by dipping it in Treatment Solution C for 60 seconds at 40° C. while applying a direct current (Table 4, step 6). The lead frame was connected as the cathode. Anodes were made of steel. The current density at the cathode was 9 A/d m².

The lead frame was then rinsed with deionised water (<2 μS) (30 seconds, 60° C.) and dried for 10 minutes at 65° C. (Table 4, steps 7 and 8).

The steps carried out in this example and the process conditions are summarized in Table 4. (Note that steps 3 to 5 are carried out in view of the presence of copper (alloy) on the surface of the lead frame; these steps are not required for improving the adhesion to the silver surfaces and are not an essential part of the method according to the present invention.)

TABLE 4

Process steps carried out in Example 2

| No. | Process step | Solution | Dip time [s] | Temperature [° C.] |
|---|---|---|---|---|
| 1 | Alkaline Cleaning | Standard compositions for degreasing | 60 | 55 |
| 2 | Etch Cleaning |  | 30 | 30 |
| 3 | Activation | MoldPrep LF Activator ™[(1)] | 60 | 45 |
| 4 | Roughening | 50 ml/l sulfuric acid (96 wt.-%) 40 ml/l hydrogen peroxide (30 wt.-%) 10 g/l benzotriazole 0.5 g/l formamidine sulfinic acid 5 g/l sodium fluoride 33 mg/l sodium chloride | 60 | 40 |
| 5 | Cu Cleaning | 50 g/l NaOH aqueous solution | 25 | 35 |
| 6 | Adhesion Improvement Treatment | Treatment solution C | 60 | 40 |
| 7 | Final Rinse | deionised water (<2 μS) | 30 | 60 |
| 8 | Drying | — | 600 | 65 |

[(1)]Product of Atotech Deutschland GmbH (see also EP 1 820 884 A1)

Then a mold was applied by injection molding and the lead frame was subjected to various baking conditions. Thereafter it was subjected to the Tab Pull Test and Bond Test as specified above. For comparison, the tests were also carried out on a lead frame which had been treated in the same way, except that the electrolytic adhesion improvement treatment according to the present invention (Table 4, step 6) had been omitted.

The results of the Tab Pull Test and the Bond Test are set forth in Tables 5 and 6, respectively.

TABLE 5

Results of Tab Pull Tests carried out in Example 2.

| Specimen tested | Baking treatment | | |
|---|---|---|---|
|  | No bake | Bake[(1)] | Extreme bake[(2)] |
|  | Pull shear strength [kg] | | |
| Lead frame treated according to the invention | 13.8 | 16.3 | 11.0 |
| Comparison | 5.6 | 6.0 | 5.0 |

[(1)]1 h at 175° C. in oven plus 2 min at 200° C. on hotplate
[(2)]1 h at 175° C. in oven plus 1 h at 200° C. on hotplate

TABLE 6

Results of the Bond Test carried out in Example 2.

| Specimen tested | Bond strength[(1)] [cN] |
|---|---|
| Lead frame treated according to the invention | 8.7 ± 0.5 |
| Comparison | 9.1 ± 0.8 |

[(1)]Average of 30 measurements ± standard deviation

The results in Table 6 show that the electrolytic adhesion improvement treatment according to the present invention has no significant (i.e. no detrimental) effect on bond strength. More specifically, in the Bond Test, all bonds showed breakage of the wire or at the neck or heel, but no ball or wedge lift (i.e. detachment at the wire ends).

Example 3

Example 1 was repeated with the following modifications: In the electrolytic adhesion improvement treatment step, Treatment Solution A was replaced by Treatment solution B; anodes were made of V4A stainless steel; the current density at the cathode was 16 A/dm$^2$; the treatment time was 30 seconds. The results of the Lab Peeling Test on the silver foils thus obtained are set forth in Table 7.

TABLE 7

Results of the Lab Peeling Tests carried out in Example 3.

| Specimen tested | Adhesion strength[1] [N/cm] |
|---|---|
| Silver foil treated according to the invention | 2.87 ± 0.21 |
| Comparison | 1.41 ± 0.06 |

[1]Average of 5 measurements ± standard deviation

Example 4

Example 1 was repeated with the following modifications: The silver foil was pre-treated according to the MoldPrep LF™ process (Table 4, steps 1 to 5). In the electrolytic adhesion improvement treatment step, Treatment Solution A was replaced by Treatment solution C; anodes were made of stainless steel; the temperature was 45° C.; the treatment time was 30 seconds. The results of the Lab Peeling Test on the silver foils thus obtained are set forth in Table 8.

TABLE 8

Results of the Lab Peeling Tests carried out in Example 4.

| Specimen tested | Adhesion strength [N/cm] |
|---|---|
| Silver foil treated according to the invention | 2.5 |
| Comparison | 0.5 |

Example 5

Example 2 was repeated with the following modifications: In the electrolytic adhesion improvement treatment step, Treatment Solution A was replaced by Treatment solution D; the temperature was 45° C.; the treatment time was 35 seconds; the current density at the cathode was 12 A/dm$^2$.

The results of the Tab Pull Test and the Bond Test are set forth in Tables 9 and 10, respectively.

TABLE 9

Results of Tab Pull Tests carried out in Example 5.

| | Baking treatment | | |
|---|---|---|---|
| Specimen tested | No bake | Bake[1] | Extreme bake[1] |
| | Pull shear strength [kg] | | |
| Lead frame treated according to the invention | 19.4 | 19.6 | 17.9 |
| Comparison | 4.6 | 4.8 | 5.2 |

[1]see Table 5

TABLE 10

Results of the Bond Test carried out in Example 5.

| Specimen tested | Bond strength [cN] |
|---|---|
| Lead frame treated according to the invention | 8.9 ± 0.7 |
| Comparison | 10.2 ± 0.9 |

Example 6

Two lead frames with 22 individual surface mounted devices (Quad Flat Packages) each were investigated. The lead frames were partially plated with silver, i.e. they contained surface areas of the base material copper and surface areas composed of silver. One lead frame was tested without any treatment of the silver surface prior to mold application, i.e., only process steps 1 to 5 (see Table 4) which enhance the adhesion between a mold and copper surfaces were carried out. The second lead frame was additionally treated with Solution A (see Table 2; current density: 9 A/dm$^2$, temperature: 40° C., time: 60 s) in a process sequence as shown in Table 4. The delamination of mold after MSL tests of level 1 to 3 (see Table 1) was investigated with a C-mode scanning acoustic microscope (C-SAM). The numbers of failed devices on each lead frame are summarized in Table 11. No failure for level 1 to 3 MSL tests was observed after treatment of the silver surface areas with Solution A.

TABLE 11

Results of MSL Tests carried out in Example 6 (Number of devices that failed out of total of 22 devices).

| | Test | | |
|---|---|---|---|
| Treatment prior to mold application | MSL1 | MSL2 | MSL3 |
| None | 19 | 5 | 0 |
| Treatment with solution A | 0 | 0 | 0 |

Example 7

A silver foil was degreased with an organic solvent. It was then subjected to an electrolytic adhesion improvement treatment according to the present invention by dipping it in a solution, containing the chemicals as described below in Table 12. The dipping time was 60 seconds at 45° C. while applying a direct current. The silver foil was connected as the cathode. Anodes were made of steel. The current density at the cathode was 16 A/dm$^2$.

The silver foil was then subjected to the Lab Peeling Test as specified above. The results are shown in Table 12. For comparison, the test was carried out on a silver foil which had only been degreased but not subjected to the electrolytic adhesion improvement treatment according to the present invention.

TABLE 12

Results of Lab Peeling Tests carried out in Example 7.

| Components of treatment solution | Concentrations of components [g/l] | Adhesion strength [N/cm] |
|---|---|---|
| None (for comparison) | — | 1.1 |
| NaOH | 12 | 1.7 |

TABLE 12-continued

Results of Lab Peeling Tests carried out in Example 7.

| Components of treatment solution | Concentrations of components [g/l] | Adhesion strength [N/cm] |
|---|---|---|
| NaOH + Na tripolyphosphate | 12 + 7 | 1.6 |
| NaOH + Na metasilicate | 12 + 20 | 2.9 |
| NaOH + Na tripolyphosphate + Na metasilicate | 12 + 7 + 20 | 3.4 |

The invention claimed is:

1. A method for producing a surface mounted electronic device comprising the following steps carried out in this order:
   (i) providing a lead frame having copper and silver surfaces,
   (ii) electrolytically treating the silver surfaces of the lead frame with a solution containing a hydroxide selected from alkali metal hydroxides, alkaline earth metal hydroxides, ammonium hydroxides and mixtures thereof, wherein the lead frame is a cathode, and
   (iii) encapsulating an electronic device together with the lead frame using a resin material;
   wherein the concentration of the hydroxide in the treatment solution is from 10 to 500 g/l, and wherein the step of electrolytically treating the silver surface is carried out without depositing any metals on the silver surface.

2. The method of claim 1, wherein the solution is essentially free of metal ions other than alkali or alkaline earth metal ions.

3. The method of claim 1, wherein the temperature of the solution with which the silver surface is treated is from 20 to 50° C.

4. The method of claim 1, wherein the duration of the electrolytic treatment is from 5 to 300 seconds.

5. The method of claim 1, wherein the cathodic current density applied in the step of electrolytically treating the silver surface is from 2 to 40 A/dm$^2$.

6. The method of claim 1, wherein the hydroxide is sodium hydroxide or potassium hydroxide.

7. The method of claim 1, wherein the treatment solution additionally contains a silicate salt.

8. The method of claim 7, wherein the concentration of the silicate salt in the treatment solution, is from 1 to 100 g/l.

9. The method of claim 1, wherein the treatment solution contains one or more conductivity-enhancing salts.

10. The method of claim 9, wherein the concentration of conductivity-enhancing salts in the treatment solution is from 1 to 100 g/l.

11. The method of claim 1, wherein the treatment solution contains one or more surfactants.

12. A method for producing a surface mounted electronic device comprising the following steps carried out in this order:
   (i) providing a lead frame having copper and silver surfaces,
   (ii) roughening the Cu surfaces,
   (iii) electrolytically treating the silver surfaces of the lead frame with a solution containing a hydroxide selected from alkali metal hydroxides, alkaline earth metal hydroxides, ammonium hydroxides and mixtures thereof, wherein the lead frame is a cathode, and
   (iv) encapsulating an electronic device together with the lead frame using a resin material;
   wherein the concentration of the hydroxide in the treatment solution is from 10 to 500 g/l, and wherein the step of electrolytically treating the silver surface is carried out without depositing any metals on the silver surface.

* * * * *